United States Patent [19]

Shaffer

[11] 4,420,301

[45] Dec. 13, 1983

[54] MINIATURE MULTILAMP PHOTOFLASH ARRAY

[75] Inventor: John W. Shaffer, Williamsport, Pa.

[73] Assignee: GTE Products Corporation, Stamford, Conn.

[21] Appl. No.: 277,797

[22] Filed: Jun. 29, 1981

[51] Int. Cl.³ ............................................... F21K 5/00
[52] U.S. Cl. ..................... 431/359; 313/244; 362/11
[58] Field of Search ............... 431/359, 365, 357, 358; 362/10, 11, 13, 14, 15; 313/241, 244, 240, 252

[56] References Cited

U.S. PATENT DOCUMENTS 4,133,023  1/1979  Hanson .......................... 431/359 X
4,240,786  12/1980  Heytmeiser ......................... 431/359
4,325,771  4/1982  Brower et al. ................... 431/357 X Primary Examiner—Samuel Scott
Assistant Examiner—Randall L. Green
Attorney, Agent, or Firm—Thomas H. Buffton

[57] ABSTRACT

A miniaturized multilamp photoflash array includes a housing member having a back portion with a printed electrical circuit on one surface thereof and a light transmittable front portion affixed to the back portion with a plurality of flashlamps affixed to and supported by the array and each flashlamp having a pair of electrical conductors in electrical contact with the printed circuit on one surface of the back portion of the housing member.

13 Claims, 5 Drawing Figures

MINIATURE MULTILAMP PHOTOFLASH ARRAY

TECHNICAL FIELD

This invention relates to multilamp photoflash arrays and more particularly to a miniaturized multilamp photoflash array having a multiplicity of flashlamps each having electrical conductors contacting a printed circuit.

BACKGROUND ART

In the field of photography, the use of multilamp photoflash devices has long been known. For example, the so-called Flashcube or Hi-Power Cube provided lamp leads which were directly accessible for contact with the potential source electrodes of a camera. Thereafter, a Flash Bar array was provided wherein the flashlamps were soldered directly to a printed circuit board which, in turn, had an external connection means formed for electrical coupling of the printed circuit to the camera.

Also, the so-called Flip Flash array was developed wherein the printed circuit board included a plurality of affixed eyelets and the electrical conductors of the flashlamps were crimped into the eyelets of the circuit board. In another construction, a Topflash structure had a printed circuit board with affixed eyelets and the leads of the flashlamps were passed through the eyelets of the printed circuit board. Moreover, a following structure, referred to as the Super 10, eliminated the eyelets from the printed circuit board, but had the lamp leads pass through holes in the printed circuit board and then directly crimped in place.

Although all of the above-mentioned arrays and coupling of the flashlamps to the printed circuit boards have been and still are utilized in varying amounts, it has been found that each leaves something to be desired. For instance, soldering of the lamp leads directly to the printed circuit board encountered difficulties because of the tendency for the solder or web or form strands bridging adjacent circuits on the circuit board. Also, soldering necessitates the use of relatively expensive materials such as silver or copper. Moreover, the substrates must be of a heat-resistant material, such as phenolic material, for example.

Additionally, eyelets are relatively expensive items and especially so when the cost of attaching the eyelets is included. Moreover, eyelets or printed circuit boards wherein the electrical conductors of the flashlamps pass through the printed circuit board are deleterious to the appearance of the printed circuit board. Thus, additional members to serve as a backing are required in order to enhance the appearance of the structure. Obviously, additional members add to the cost of materials and labor.

Further, presently available multilamp photoflash arrays tend to be rather large and cumbersome to a photographer intent on a number of pictures. For example, early flashlamps were in the form of a single bulb. This structure was followed by the four-lamp flashcube. Thereafter, a more compact "Flash Bar" with a 10-flash capability became available and was followed by multiple arrays such as the Flip Flash and the Super 10 wherein a much more compact structure provided an increased flash capability.

However, the appearance of faster films or film having a faster speed has permitted the production of flashlamp arrays wherein the light requirements may be reduced. Thus, it has been found that the present-day photographer is no longer willing to endure relatively large and cumbersome flashlamp arrays. Rather, miniaturized flashlamp arrays employing sub-miniature flashlamps providing a reduced amount of light, but utilized with faster films, appears to be the acceptable combination of the present time.

OBJECTS AND SUMMARY OF THE INVENTION

An object of the present invention is to provide an enhanced multilamp photoflash array. Another object of the invention is to improve the structural configuration of a multilamp photoflash array. Still another object of the invention is to improve the electrical coupling of the flashlamps and printed circuit board of a multilamp photoflash array. A further object of the invention is to provide electrical contact of a multiplicity of flashlamps with a single surface of a printed circuit board.

These and other objects, advantages and capabilities are achieved in one aspect of the invention by a multilamp photoflash array having a housing member with attachable front and back portions with a light transmittable front portion and a printed circuit on the inner surface of the back portion, a reflector unit having a plurality of cavities for receiving flashlamp disposed intermediate the front and back portions and a flashlamp located in each cavity with a pair of electrical conductors extending through the reflector unit and contacting the printed circuit on the inner surface of the back portion.

BEST MODE FOR CARRYING OUT THE INVENTION

For a better understanding of the present invention, together with other and further objects, advantages and capabilities thereof, reference is made to the following disclosure and appended claims in connection with the accompanying drawings.

Figure 1:
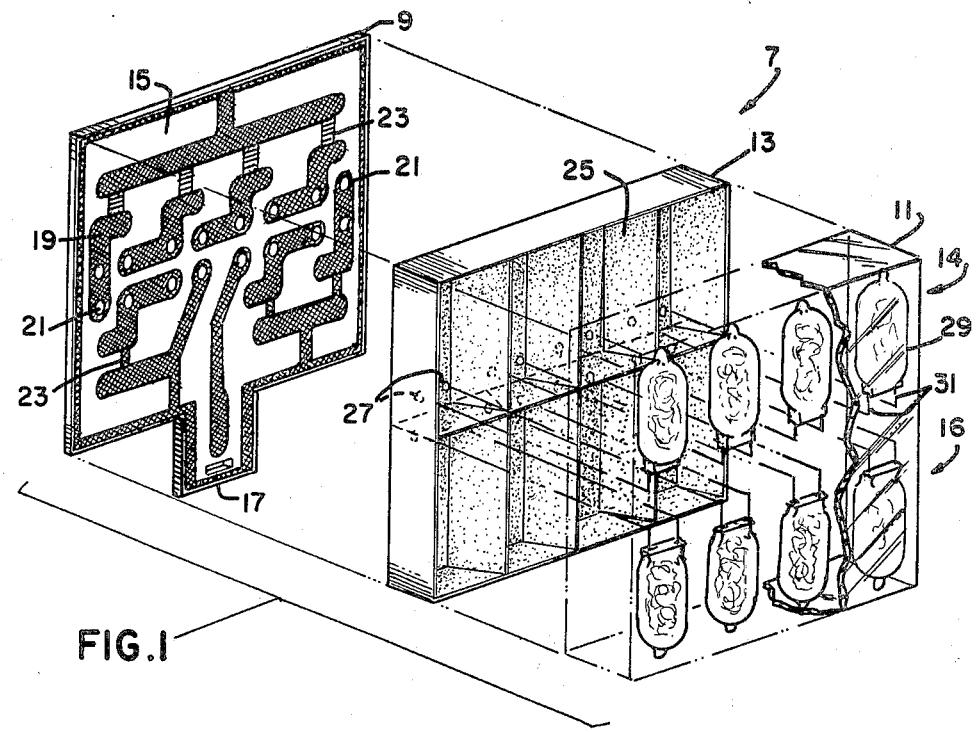
FIG. 1 is an isometric view, in exploded form, of a preferred embodiment of the invention.

Referring to the drawings, a miniaturized multilamp photoflash array is illustrated in the isometric view of FIG. 1. This photoflash array includes a housing member 7 having a back portion 9 and a front portion 11. A reflector unit 13 is disposed intermediate the back and front portions 9 and 11 of the housing 7.

The back portion 9 includes an outer surface (not shown), an inner surface 15 and a camera mounting means 17. A printed circuit 19 is affixed to the inner surface 15 of the back portion 9 and includes a plurality of electrical contact surfaces 21 as well as a plurality of radiation-responsive switches 23. Also, the printed circuit 19 extends to the camera mounting means 17 to provide for electrically coupling the printed circuit 19 to an energization source within a camera (not shown).

Although the printed circuit 19 may be of a relatively expensive material, such as silver or copper, it has been found that the employment of electrical contact surfaces 21 renders the use of such materials unnecessary. In other words, the utilization of contact surfaces 21 to provide electrical connections removes the necessity for solder or eyelet connections, and thus permits the use of relatively inexpensive printed circuit material, such as aluminum, for example.

Further, the printed circuit 19 is preferably in the form of die-stamped circuitry as described, for example, in U.S. Pat. No. 3,990,142 of Weglin and copending applications bearing Ser. Nos. 131,614 and 131,711 and assigned to the Assignee of the present application. It has been found that the use of die-stamped circuitry is especially suitable when the printed circuit 19 is of inexpensive aluminum material, includes radiation-responsive switches 23, electrical contact surfaces 21 rather than solder connections, and is of a miniaturized construction.

Moreover, it has also been found that the utilization of the above-mentioned electrical contact surfaces 21, rather than solder connections or eyelets, permits the use of relatively inexpensive substrate materials rather than heat-resistant and expensive phenolic materials. Also, the electrical contact surfaces 21 elimimate the need for passage of electrical conductors through the back portion 9 of the housing member 7 whereby added electrical insulation and product appearance materials are no longer required.

The front portion 11 of the housing member 7 is of a light transmittable material, such as a color-correcting plastic, for example. This front portion 11 is attached or attachable to the back portion 9 to provide the desired housing member or enclosure 7.

In this embodiment, a reflector unit 13 is disposed intermediate the back and front portions 9 and 11 of the housing member 7. The reflector unit 13 is preferably in the form of a plastic, either white or having a reflective surface affixed thereto, and may be formed by any one of a number of well-known techniques such as injection-molding or thermoforming, and includes upper and lower sectors 14 and 16, each having a plurality of spaced cavities 25.

The reflector unit 13 includes a plurality of spaced cavities 25, each having a pair of apertures 27 therethrough. A flashlamp 29 is located in each one of the spaced cavities 25 and includes a pair of electrical conductors 31 which pass through the apertures 27 and are supported by the reflector unit 13.

Figure 2:
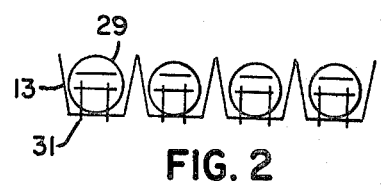
FIG. 2 is a sectional view of a form of reflector unit and flashlamp arrangement suitable to the embodiment of FIG. 1.
Figure 3:
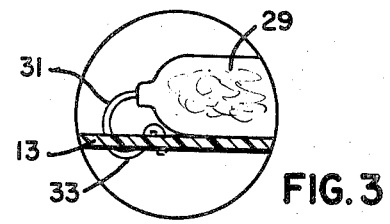
FIG. 3 is an exploded cross-sectional view of the flashlamp and reflector unit of FIG. 2.

As can be more readily seen in FIGS. 2 and 3, a flashlamp 29 has a pair of electrical conductors 31 which pass through the apertures 27 of the reflector unit 13. Moreover, the electrical conductors 31 may be repeatedly passed through the reflector unit 13, as illustrated in FIG. 3, to provide support for the flashlmap 29. Also, the electrical conductors 31 each have a contacting portion 33 which is formed to cooperate with the electrical contact surface 21 of the printed circuit 19 on the inner surface 15 of the back portion 9.

Figure 4:
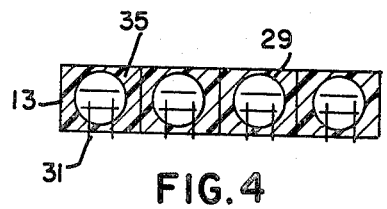
FIG. 4 is a sectional view of an alternate reflector unit and flashlamp arrangement suitable to the embodiment of FIG. 1.
Figure 5:
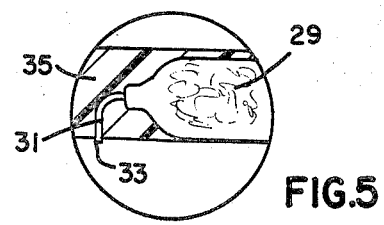
FIG. 5 is an exploded cross-sectional view of the flashlamp and reflector unit of FIG. 4.

FIGS. 4 and 5 illustrate an alternative embodiment wherein the flashlamps 29 are embedded in a plastic 35 by any one of a number of well-known methods such as injection-molding or potting. Again, the electrical conductors 31 are formed and located to pass through the plastic 35 and to contact the electrical contact surfaces 21 of the printed circuit 19. As can be seen in FIG. 5, the electrical conductors 31 project from the plastic 35 in an amount sufficient to cooperate with the electrical contact surfaces 21 of the printed circuit 19.

Thus, there has been provided a miniaturized multilamp photoflash array wherein a plurality of lamps are mounted on an array member other than the printed circuit board. Then, electrical contact of the lamps and the printed circuit board is effected by orienting the lamp-carrying member over the circuit board and affixing the lamp-carrying member to the array. Alternatively, other parts of the array may be utlized to establish contact between the printed circuit board and the lamp as, for example, an array cover.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

A unique miniaturized multilamp photoflash array which has a lamp packing density of about four or more lamps per square inch of array face is provided. The array provides a construction wherein the electrical contacts for the lamps do not pass through and are not attached to a printed circuit board. Rather, the lamps are supported by other parts of the array and oriented to make proper contact with the printed circuit board when the other parts of the array are properly affixed.

The construction is especially adapted to automated manufacture at a reduced cost because of the elimination of such undesired features as soldering. Also, relatively inexpensive aluminum foil circuitry, as well as relatively inexpensive thermoplastic sheets, may be utilized because soldering and the heat necessitated thereby are eliminated. Further, the establishment of electrical contact between lamp and printed circuit board without eyelets or passage through the circuit board permits the utilization of the back of the circuit board as an insulating member or as an enhancement to the product.

I claim:
1. A multilamp photoflash array comprising:
   a housing member having a back portion and an attachable front portion, said back portion having inner and outer surfaces and a camera mounting means extending outwardly therefrom and said front portion being light transmittable;
   a printed circuit disposed on said inner surface of said back portion of said housing member and on said camera mounting means for providing an electricl signal from a camera to said printed circuit;
   a reflector unit disposed intermediate said back and front portions of said housing member, said reflector unit having a plurality of cavities each having a reflective surface and formed to receive a flashlamp; and
   a flashlamp disposed within each one of said cavities of said reflector unit and characterized by the improvement wherein each of said flashlamps has a pair of electrical conductors extending through and supported by said reflector unit and contacting said printed circuit on said inner surface of said back portion of said housing member.

2. The multilamp photoflash array of claim 1 wherein said reflector unit is in the form of solid plastic and each one of said flashlamps has a pair of electrical conductors extending through and supported by said solid plastic and contacting said printed circuit on said inner surface of said back portion of said housing member.

3. The multilamp photoflash array of claim 1 wherein said reflector unit includes first and second spaced sectors with each sector having a plurality of aligned cavities each having a flashlamp therein.

4. The multilamp photoflash array of claim 1 wherein said reflector unit includes first and second spaced sectors with each sector having four aligned cavities each having a flashlamp therein.

5. The multilamp photoflash array of claim 1 wherein said printed circuit includes a plurality of radiation-responsive switches each coupled to a flashlamp and activated by radiation therefrom to provide a substantially open-circuit thereto.

6. The multilamp photoflash array of claim 1 wherein said reflector unit includes first and second spaced sectors each having a plurality of aligned cavities each containing a flashlamp and said printed circuit includes a radiation-responsive switch for all except one of said flashlamp.

7. The multilamp photoflash array of claim 1 wherein said printed circuit is in the form of a die-stamped electrically conductive network.

8. The multilamp photoflash array of claim 7 wherein said die-stamped electrically conductive network is aluminum.

9. In a multilamp photoflash array having a housing member with a back portion including a camera mounting means, an outer surface and an inner surface with a printed circuit thereon, a reflector unit attached to said back portion and an attached front portion of light transmittable material with a plurality of flashlamps affixed to the reflector unit and characterized by the improvement wherein each flashlamp has a pair of electrical conductors passing through and supported by said reflector unit and contacting said printed circuit on said inner surface of said back portion of said housing member.

10. The multilamp photoflash array of claim 9 wherein said printed circuit includes a radiation-responsive switch for all but one of said flashlamps of said multilamp photoflash array.

11. The multilamp photoflash array of claim 9 wherein said array includes a reflector unit in the form of a solid plastic surrounding and supporting each one of said flashlamps wherein each flashlamp includes a pair of electrical conductors extending through said solid plastic and contacting said printed circuit to provide electrical contact between said printed circuit and said flashlamps.

12. The multilamp photoflash array of claim 9 wherein said printed circuit is in the form of a die-stamped electrically conductive network.

13. The multilamp photoflash array of claim 9 wherein said printed circuit is in the form of an electrically conductive network of aluminum, and each of said flashlamps is in electrical contact with said printed circuit.

* * * * *